United States Patent [19]

Muranaka

[11] Patent Number: 5,168,244
[45] Date of Patent: Dec. 1, 1992

[54] ELECTRIC CIRCUIT FABRICATED FROM MAGNETO-RESISTIVE ELEMENTS AND ACTIVE CIRCUIT ELEMENTS

[75] Inventor: Masami Muranaka, Tokyo, Japan

[73] Assignee: NEC Corporation, Tokyo, Japan

[21] Appl. No.: 895,937

[22] Filed: Jun. 9, 1992

[30] Foreign Application Priority Data

Jun. 19, 1991 [JP] Japan .................................. 3-146377

[51] Int. Cl.$^5$ ............................................ H03F 3/45
[52] U.S. Cl. .................... 330/257; 307/309; 330/146
[58] Field of Search ............... 330/6, 62, 146, 257; 307/309; 360/67, 68; 365/8, 158, 209

[56] References Cited
U.S. PATENT DOCUMENTS 3,708,700  1/1973  Moser .................................. 307/309

FOREIGN PATENT DOCUMENTS 54-41335  12/1979  Japan .

Primary Examiner—James B. Mullins

[57] ABSTRACT

A differential amplifier circuit comprises a current mirror circuit associated with an electric power source, and an amplifier circuit for developing differential voltage produced between a pair of output nodes of the current mirror circuit, and the current mirror circuit is implemented by a first series combination of a first magneto-resistive element, a first bipolar transistor and a second magneto-resistive element and a second series combination of a third magneto-resistive element, a second bipolar transistor and a fourth magneto-resistive element, wherein the first to fourth magneto-resistive elements are arranged in such a manner that variation of magnetic field has the same influence on the first and fourth magneto-resistive elements and on the second and third magneto-resistive elements so that the characteristics of the current mirror circuit is hardly affected by fluctuation of device characteristics of either first or second bipolar transistor.

6 Claims, 4 Drawing Sheets

ELECTRIC CIRCUIT FABRICATED FROM MAGNETO-RESISTIVE ELEMENTS AND ACTIVE CIRCUIT ELEMENTS

FIELD OF THE INVENTION

This invention relates to a magneto-resistive element and, more particularly, to circuit arrangements of a differential amplifier circuit having magneto-resistive elements.

DESCRIPTION OF THE RELATED ART

In FIG. 1, a typical example of a parallel combination of magneto-resistive elements 1 and 2 is coupled with a parallel combination of n-p-n type bipolar transistors 3 and 4, and the base nodes of the bipolar transistors 3 and 4 are coupled with the collector nodes of the n-p-n type bipolar transistor 3 for implementing a current mirror circuit 5. A current source 6 is coupled between the magneto-resistive elements 1 and 2 and the emitter nodes of the n-p-n type bipolar transistors 3 and 4, and supplies current to the current mirror circuit 5. The collector nodes of the n-p-n type bipolar transistors 3 and 4 are coupled in parallel with input nodes of an amplifier circuit 7, and the amplifier circuit 7 develops the differential voltage level between the collector nodes. Though not shown in FIG. 1, magnetic field is created around the magneto-resistive elements 1 and 2, and the resistances of the magneto-resistive elements 1 and 2 are variable with the magnetic field.

If the magnetic field changes the intensity at the magneto-resistive element 1, the magneto-resistive element 1 varies the resistance by dR1, and the collector voltage level of the n-p-n type bipolar transistor 3 is changed as $$dV1 = (Vcc - Vbe3)\, dR1/R0 \qquad \text{Equation 1}$$

where dV1 is variation of the collector voltage level of the n-p-n type bipolar transistor 3, Vcc is voltage level produced by the current source 6, Vbe3 is a forwardly biassing voltage level between the base node and the emitter node of the n-p-n type bipolar transistor 3, and R0 is the resistance of each of the magneto-resistive elements 1 and 2 before the variation of the magnetic field.

The variation of the magnetic field further affects the resistance of the magneto-resistive element 2, and the collector voltage level of the n-p-n type bipolar transistor 4 is changed as $$dV2 = -(Vcc - Vbe4)\, dR2/R0 \qquad \text{Equation 2}$$

where dV2 the variation of the collector voltage level of the n-p-n type bipolar transistor 4, Vbe4 is a forwardly biassing voltage level between the base node and the emitter node of the n-p-n type bipolar transistor 4, and dR2 is variation of the resistance of the magneto-resistive element 2. The difference between the variations dV1 and dV2 is supplied to the amplifier circuit 7, and is increased so as to produce an output signal OUT1.

However, if process parameters of fabrication process for the n-p-n type bipolar transistors 3 and 4 fluctuate, the forwardly biassing voltage level Vbe3 is liable to be different from the forwardly biassing voltage level Vbe4, and difference dVbe takes place between the forwardly biassing voltage levels Vbe3 and Vbe4. Difference dI in current between the collector nodes is given as Equation 3.

$$dI = 1 - \exp\{dVbe/(26 \times 10^{-3})\} \qquad \text{Equation 3}$$

If the difference dVbe is 1 millivolt, the difference dI is of the order of 4 per cent. The rate of change in the resistance of a magneto-resistive element is of the order of 1 per cent, and requests the manufacturer to restrict the difference dI not greater than 1 per cent. However, such a strict criterion deteriorates the production yield of the n-p-n type bipolar transistor, and the manufacturer suffers from increase of the production cost due to a large number of detective n-p-n type bipolar transistors.

SUMMARY OF THE INVENTION

It is therefore an important object of the present invention to provide an electric circuit fabricated from magneto-resistive elements and active circuit elements which is less affectable by fluctuation of device characteristics of the active circuit elements.

To accomplish the object, the present invention proposes to insert two pairs of magneto-resistive elements in two series combinations of a current mirror circuit.

In accordance with the present invention, there is provided an electric circuit associated with a magnetic member, comprising: a) a current mirror circuit having a-1) a first series combination of a first magneto-resistive element, a first transistor with a first control node for changing current driving capability thereof and a second magneto-resistive element, and a-2) a second series combination of a third magneto-resistive element, a second transistor with a second control node for changing current driving capability thereof and a fourth magneto-resistive element, the first and second control nodes being coupled with one of a first output node between the first magneto-resistive element and the first transistor and a second output node between the third magneto-resistive element and the second transistor, variation of the magnetic field of the magnetic member substantially having the same influence on the first and fourth magneto-resistive elements and on the second and third magneto-resistive elements, the variation of the magnetic field having different influence between the first and fourth magneto-resistive elements and the second and third magneto-resistive elements; b) an electric power source coupled between both ends of the first series combination and between both ends of the second series combination for supplying current thereto; and c) an amplifier circuit having two input nodes respectively coupled with the first and second output nodes, and operative to develop differential voltage produced therebetween.

BRIEF DESCRIPTION OF THE DRAWINGS

The features and advantages of the electric circuit according to the present invention will be more clearly understood from the following description taken in conjunction with the accompanying drawings in which.

DESCRIPTION OF THE PREFERRED EMBODIMENTS

First Embodiment

Figure 1:
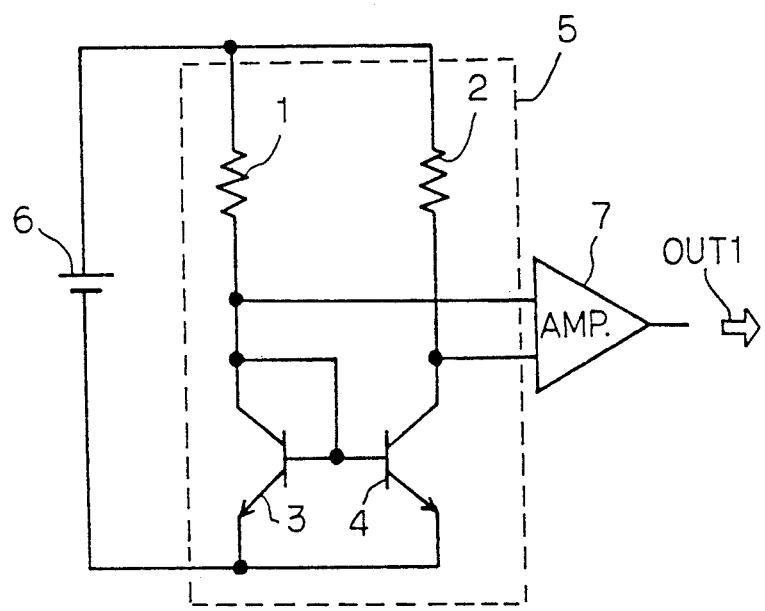
FIG. 1 is a circuit diagram showing the circuit arrangement of the prior art differential amplifier circuit.
Figure 2:
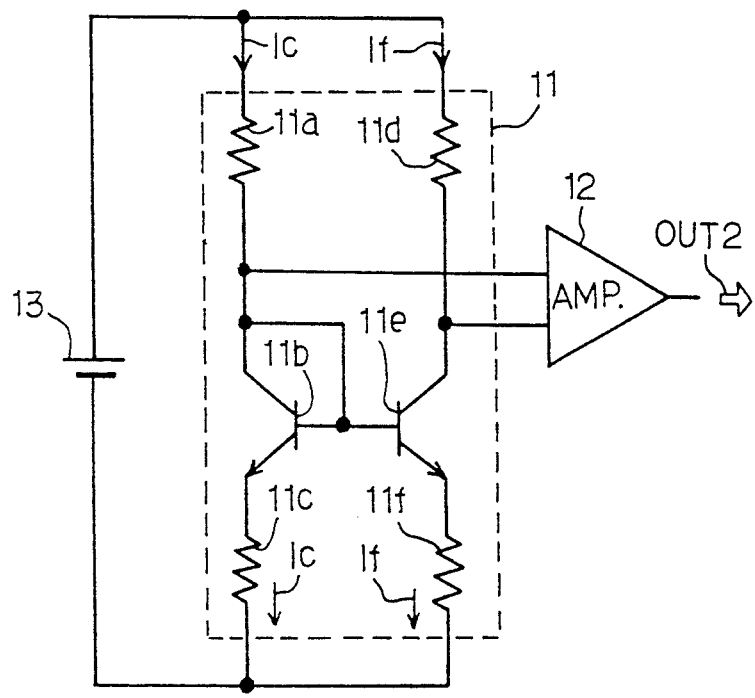
FIG. 2 is a circuit diagram showing the circuit arrangement of a differential amplifier circuit according to the present invention.

Referring to FIG. 2 of the drawings, a differential amplifier circuit embodying the present invention largely comprises a current mirror circuit 11 and an amplifier circuit 12. The current mirror circuit 11 is implemented by a first series combination of a first magneto-resistive element 11a, an n-p-n type bipolar transistor 11b and a second magneto-resistive element 11c and a second series combination of a third magneto-resistive element 11d, an n-p-n type bipolar transistor 11e and fourth magneto-resistive element 11f. The base nodes of the n-p-n type bipolar transistors 11b and 11e are coupled with the collector node of the n-p-n type bipolar transistor 11b, and, accordingly, the n-p-n type bipolar transistors 11b and 11e theoretically allows the same amount of current to pass therethrough. An electric power source 13 is coupled between the magneto-resistive elements 11a and 11d and the magneto-resistive elements 11c and 11f for supplying current to the first and second series combinations, and the collector nodes of the n-p-n type bipolar transistors 11b and 11e are coupled in parallel with two input nodes of the amplifier circuit 12. The amplifier circuit 12 develops differential voltage level between the collector nodes of the n-p-n type bipolar transistors 11b and 11e, and produces an output voltage signal OUT2. The electric power source 13 is assumed to produce dc voltage level Vcc.

Figure 3:
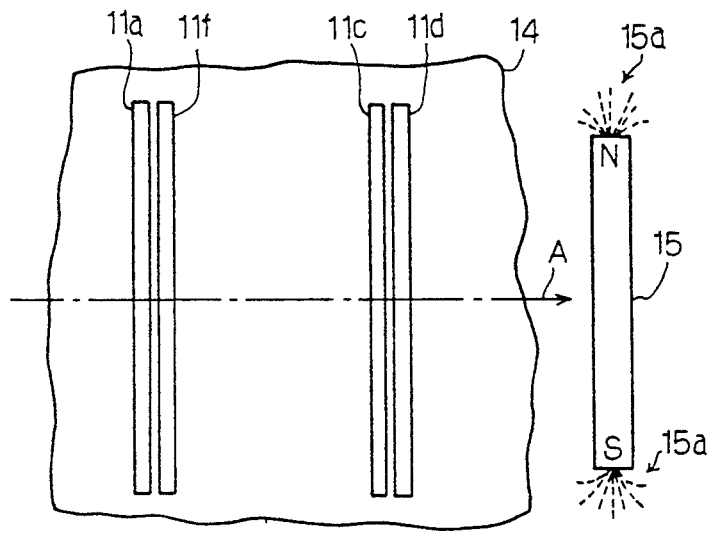
FIG. 3 is a plan view showing the layout of magneto-resistive elements incorporated in the differential amplifier circuit shown in FIG. 2.

The magneto-resistive elements 11a, 11b, 11d and 11f are sensitive to magnetic field, and varies the respective resistances with the intensity of the magnetic field. As will be better seen from FIG. 3, the magneto-resistive elements 11a and 11c are respectively paired with the magneto-resistive elements 11f and 11d, and are, accordingly, arranged to be close to the magneto-resistive elements 11f and 11d, respectively, on a substrate 14 where the n-p-n type bipolar transistors 11b and 11e are also fabricated. However, the pair of magneto-resistive elements 11a and 11f are spaced apart from the other pair of magneto-resistive elements 11c and 11d. Since a magnetic unit 15 travels over the magneto-resistive elements 11a, 11f, 11c and 11d in a direction A substantially perpendicular to the longitudinal directions of the magneto-resistive elements 11a, 11f, 11c and 11d, variation of the magnetic field 15a has the same influence on the magneto-resistive elements 11a and 11f and also on the magneto-resistive elements 11c and 11d. However, the pair of magneto-resistive elements 11a and 11f and the other pair of magneto-resistive elements 11c and 11d are differently affected by the variation of the magnetic field 15a due to the gap therebetween.

Turning back to FIG. 2 of the drawings, the magneto-resistive elements 11c and 11f are assumed to be applied with about 0.5 volt between both ends thereof, and the resistances of the magneto-resistive elements 11c and 11f are expressed as Rc and Rf, respectively. Equation 4 is established between current Ic passing through the magneto-resistive element 11c and current If passing through the magneto-resistive element 11f.

$$Ic \times Rc \approx If \times Rf \qquad \text{Equation 4}$$

Forwardly biassing voltage level Vbe is assumed to be applied between the base node and the emitter node of each n-p-n type bipolar transistor 11b or 11e, and the magneto-resistive elements 11a and 11d are respectively expressed as Ra and Rd. The collector voltage levels Vc1 and Vc2 of the n-p-n type bipolar transistors 11b and 11e are given as $$Vc1 = Vcc - Ic \times Ra \qquad \text{Equation 5}$$

$$Vc2 = Vcc - If \times Rd \qquad \text{Equation 6}$$

The current Ic passes through the magneto-resistive element 11a and, accordingly, through the magneto-resistive element 11c, and is given as $$Ic = (Vcc - Vbe)/(Ra + Rd) \qquad \text{Equation 7}$$

Differential voltage dV between the collector voltage levels Vc1 and Vc2 is calculated from Equations 4 to 7, and is given as $$\begin{aligned} dV &= Vc1 - Vc2 \\ &= \{(Vcc - Vbe)Ra/(Ra + Rd)\}\{(Rd \times Rc)/(Ra \times Rf) - 1\} \end{aligned}$$

The magnetic unit 15 traveling over the first to fourth magneto-resistive elements 11a, 11c, 11d and 11f is assumed to change the resistances of the magneto-resistive elements 11a and 11f by dRa and dRf, and delta is defined as $$\text{delta} = dRa/Ra = dRf/Rf \qquad \text{Equation 9}$$

The first and second magneto-resistive elements 11a and 11c are assumed to be approximately equal in resistance to the third and fourth magneto resistive elements 11d and 11f, respectively, without any magnetic field. When the magnetic field 15a changes the resistances of the first and fourth magneto-resistive elements 11a and 11f as indicated by Plots B of FIG. 4, the voltage variation dVc1 at the collector node of the n-p-n type bipolar transistor 11b is expressed as $$dVc1 \approx \{Ra(Vcc - Vbe)/(Ra + Rc)\} \times 2 \times \text{delta} \qquad \text{Equation 10}$$

Figure 4:
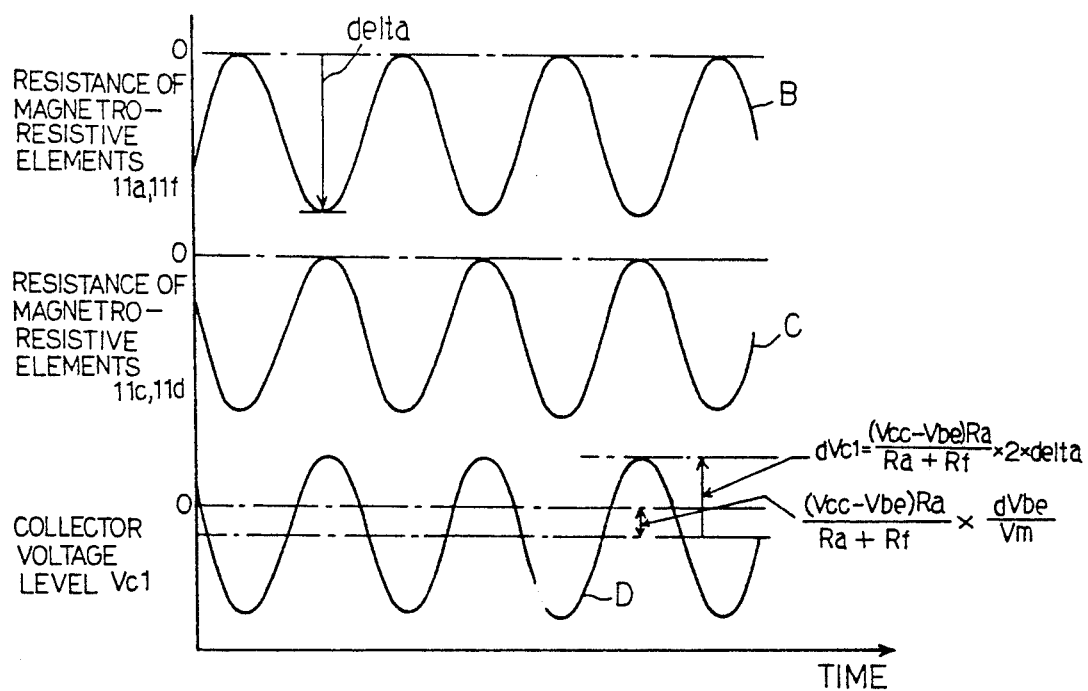
FIG. 4 is a graph showing the waveforms of voltage levels at essential nodes of the differential amplifier circuit shown in FIG. 3.

Plots D of FIG. 4 stand for the collector voltage level Vc1, and the voltage variation dVc1 is written in FIG. 4. Similarly, if the magnetic field changes the resistances of the second and third magneto-resistive elements 11c and 11d as indicated by Plots C of FIG. 4, the voltage variation dVc2 at the collector node of the n-p-n type bipolar transistor 11e is given as $$dVc2 \approx \{-Ra(Vcc - Vbe)/(Ra + Rc)\} \times 2 \times \text{delta} \qquad \text{Equation 11}$$

Comparing Equation 10 with Equation 1, the collector voltage level Vc1 of the current mirror circuit 11 is swung 2Ra/(Ra+Rc) times wider than that of the prior art current mirror circuit 5. If the resistance Ra is adopted to be four times larger than the resistance Rc, the amplitude of the collector voltage level Vc1 is 1.6 times larger than that of the prior art current mirror circuit 5.

Assuming now that fluctuation of process parameters results in difference dVbe in the base-emitter forwardly biassing voltage level Vbe between the n-p-n type bipolar transistors 11b and 11e, the current If passing through the magneto-resistive element 11d fluctuates at dIf given as $$dIf \approx dVbe/Vm \qquad \text{Equation 12}$$

where Vm is differential voltage applied between both ends of the magneto-resistive element 11c. As described hereinbefore, the fluctuation dI of the prior art current mirror circuit 5 is given by Equation 3, and dI is of the order of 4 per cent under dVbe of 1 millivolt. However, from Equation 12, dIf is decreased to 0.2 per cent under the same conditions. Thus, the current mirror circuit 11 is effective against fluctuation of the base-emitter forwardly biassing voltage Vbe. The voltage variations dVc1 and dVc2 are maximized due to dIf, and is given as $$dVc1' \approx \{Ra(Vcc-Vbe)/(Ra+Rc)\} \times (2 \times \text{delta} - dVbe/Vm) \qquad \text{Equation 13}$$

$$dVc2' \approx \{-Ra(Vcc-Vbe)/(Ra+Rc)\} \times (2 \times \text{delta} - dVbe/Vm) \qquad \text{Equation 14}$$

Difference between the collector voltage levels Vc1 and Vc2 are developed by the amplifier circuit 12, and the output signal OUT2 takes place at the output node thereof.

As will be understood from the foregoing description, the current mirror circuit 11 increases the amplitude of each of the collector voltage level Vc1 and Vc2, and is effective against fluctuation of the base-emitter forwardly biassing voltage level Vbe of either n-p-n type bipolar transistor 11b and 11e.

Second Embodiment

Figure 5:
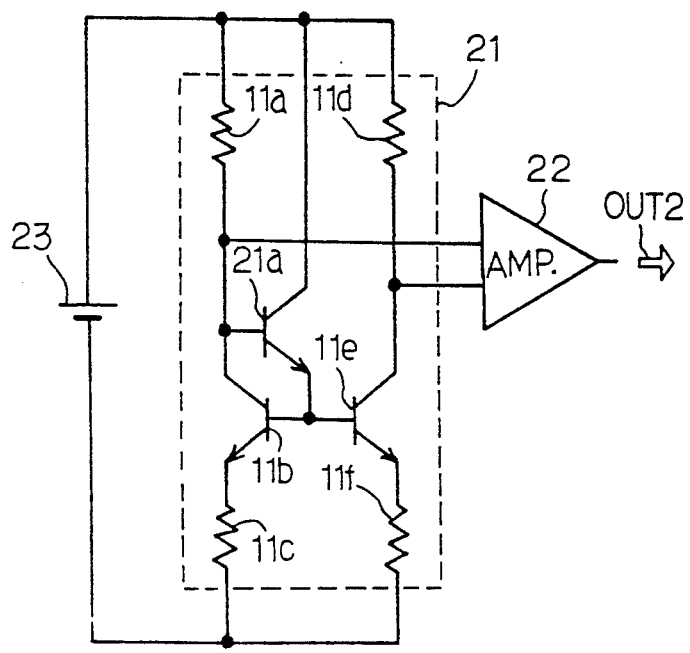
FIG. 5 is a circuit diagram showing the circuit arrangement of another differential amplifier circuit according to the present invention.

Turning to FIG. 5 of the drawings, another differential amplifier circuit embodying the present invention is illustrated, and comprises a current mirror circuit 21, an amplifier circuit 22 and an electric power source 23. The current mirror circuit 21 is similar in circuit arrangement to the current mirror circuit 11 except for an n-p-n type bipolar transistor 21a, and the other circuit components are labeled with the same references designating the corresponding components of the current mirror circuit 11 without detailed description. The n-p-n type bipolar transistor 21a has a base node coupled with the collector node of the n-p-n type bipolar transistor 11b, and provides a current path between the electric power source 23 and the base nodes of the n-p-n type bipolar transistors 11b and 11e. This circuit configuration decreases influences of base currents of the n-p-n type bipolar transistors 11b and 11e, and all the advantages of the first embodiment are also achieved by the differential amplifier circuit implementing the second embodiment.

Third Embodiment

Figure 6:
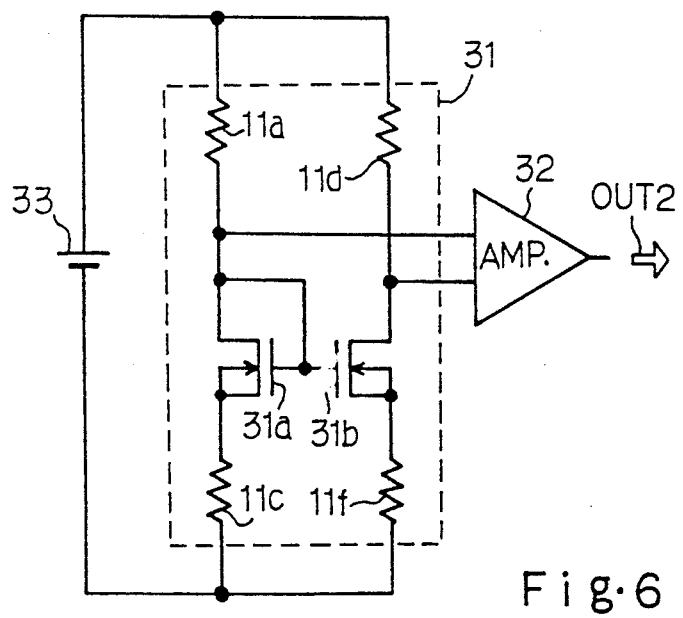
FIG. 6 is a circuit diagram showing the circuit arrangement of yet another differential amplifier circuit according to the present invention.

Turning to FIG. 6 of the drawings, yet another differential amplifier circuit embodying the present invention comprises a current mirror circuit 31, an amplifier circuit 32 and an electric power source 33. The current mirror circuit 31 is modified from the current mirror circuit 11, and the n-p-n type bipolar transistors 11b and 11e are respectively replaced with n-channel enhancement type field effect transistors 31a and 31b. However, the other circuit components are similar to those of the current mirror circuit 11, and are labeled with the same references without detailed description.

The differential amplifier circuit 31 also achieves all of the advantages of the first embodiment.

Although particular embodiments of the present invention have been shown and described, it will be obvious to those skilled in the art that various changes and modifications may be made without departing from the spirit and scope of the present invention. For example, the present invention is applicable to any electric circuit with at least two series combinations of magneto-resistive elements and active circuit elements.

What is claimed is:

1. An electric circuit associated with a magnetic member, comprising:
   a) a current mirror circuit having a first series combination of a first magneto-resistive element, a first transistor with a first control node for changing current driving capability thereof and a second magneto-resistive element, and a second series combination of a third magneto-resistive element, a second transistor with a second control node for changing current driving capability thereof and a fourth magneto-resistive element, said first and second control nodes being coupled with one of a first output node between said first magneto-resistive element and said first transistor and a second output node between said third magneto-resistive element and said second transistor, variation of the magnetic field of said magnetic member substantially having the same influence on said first and fourth magneto-resistive elements and on said second and third magneto-resistive elements, said variation of the magnetic field having different influence between said first and fourth magneto-resistive elements and said second and third magneto-resistive elements;
   b) an electric power source coupled between both ends of said first series combination and between both ends of said second series combination for supplying current thereto; and
   c) an amplifier circuit having two input nodes respectively coupled with said first and second output nodes, and operative to develop differential voltage produced therebetween.

2. An electric circuit as set forth in claim 1, in which at least said current mirror circuit is fabricated on a semiconductor substrate.

3. An electric circuit as set forth in claim 2, in which said first and third magneto-resistive elements are respectively paired with said fourth and second magneto-resistive elements, and are arranged to be close to said fourth and second magneto-resistive elements, respectively, the pair of first and fourth magneto-resistive elements being spaced apart from the pair of second and third magneto-resistive elements.

4. An electric circuit as set forth in claim 1, in which said current mirror circuit further comprises a third transistor inserted between said one of said first and second output nodes and said first and second control nodes, said third transistor having a third control node coupled with said one of said first and second output nodes for providing a current path between said electric power source and said first and second control nodes.

5. An electric circuit as set forth in claim 4, in which said first to third transistors are implemented by bipolar transistors, respectively.

6. An electric circuit as set forth in claim 1, in which said first and second transistors are respectively implemented by field effect transistors.

* * * * *